United States Patent
Taracila et al.

(10) Patent No.: US 7,973,614 B2
(45) Date of Patent: Jul. 5, 2011

(54) INVISIBLE BALUN AND METHOD OF MAKING SAME

(75) Inventors: Victor Taracila, Beachwood, OH (US); Fraser J. L. Robb, Aurora, OH (US); Aleksey Zemskov, Solon, OH (US)

(73) Assignee: General Electric Company, Schenectady, NY (US)

( * ) Notice: Subject to any disclaimer, the term of this patent is extended or adjusted under 35 U.S.C. 154(b) by 257 days.

(21) Appl. No.: 12/478,549

(22) Filed: Jun. 4, 2009

(65) Prior Publication Data

US 2010/0308934 A1    Dec. 9, 2010

(51) Int. Cl.
- *H03H 7/42* (2006.01)
- *H03H 7/38* (2006.01)
- *H01F 27/28* (2006.01)

(52) U.S. Cl. ............ 333/26; 333/33; 336/182; 324/318

(58) Field of Classification Search .......... 333/25, 333/26, 33; 336/182; 324/318, 322
See application file for complete search history.

(56) References Cited

U.S. PATENT DOCUMENTS

| | | | |
|---|---|---|---|
| 3,504,306 A * | 3/1970 | Kam ................................ 333/26 |
| 4,859,950 A | 8/1989 | Keren | |
| 5,886,589 A | 3/1999 | Mourant | |
| 6,396,362 B1 * | 5/2002 | Mourant et al. ................ 333/25 |
| 7,330,085 B2 * | 2/2008 | Ezzeddine ....................... 333/26 |
| 7,511,591 B2 * | 3/2009 | Ezzeddine ....................... 333/25 |
| 7,652,476 B2 * | 1/2010 | de Rooij et al. ............... 324/322 |
| 7,915,992 B2 * | 3/2011 | de Rooij et al. ............... 336/200 |

OTHER PUBLICATIONS

Reykowski et al., "Design of Matching Networks for Low Noise Preamplifiers," MRM, 1995, vol. 33, pp. 848-852.

* cited by examiner

*Primary Examiner* — Dean O Takaoka
(74) *Attorney, Agent, or Firm* — Ziolkowski Patent Solutions Group, SC

(57) ABSTRACT

An apparatus and method for reducing stray magnetic fields include a decoupling circuit includes a balun that comprises a transmission line. The transmission line includes a first spiral positioned substantially parallel to a first plane, the first spiral emanating from a inner portion of the first spiral in a first spiral direction. The transmission line also includes a second spiral positioned substantially parallel to the first plane, the second spiral emanating from a inner portion of the second spiral in the first spiral direction, wherein the inner portion of the first spiral is electrically coupled to the inner portion of the second spiral, and wherein the transmission line comprises a signal line and a ground line. The balun further comprises a first capacitor electrically coupled to the transmission line.

22 Claims, 9 Drawing Sheets

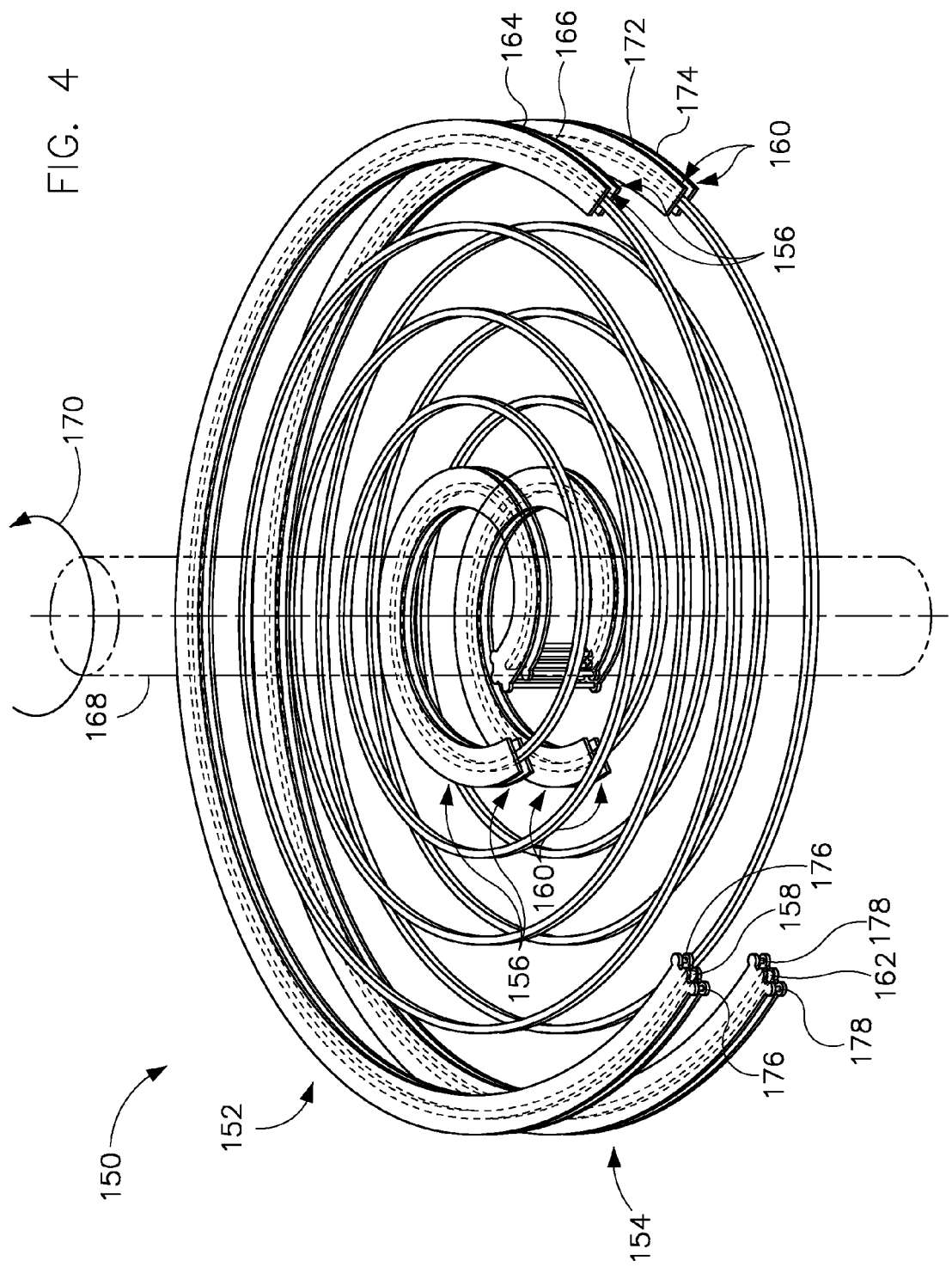

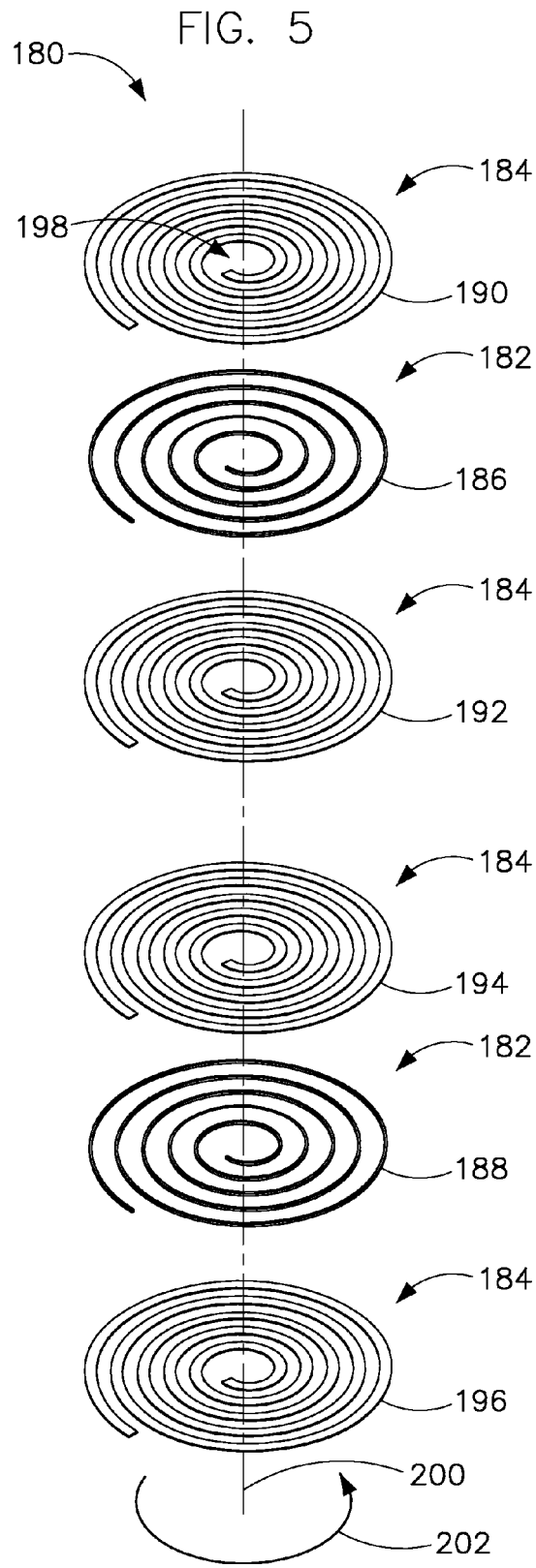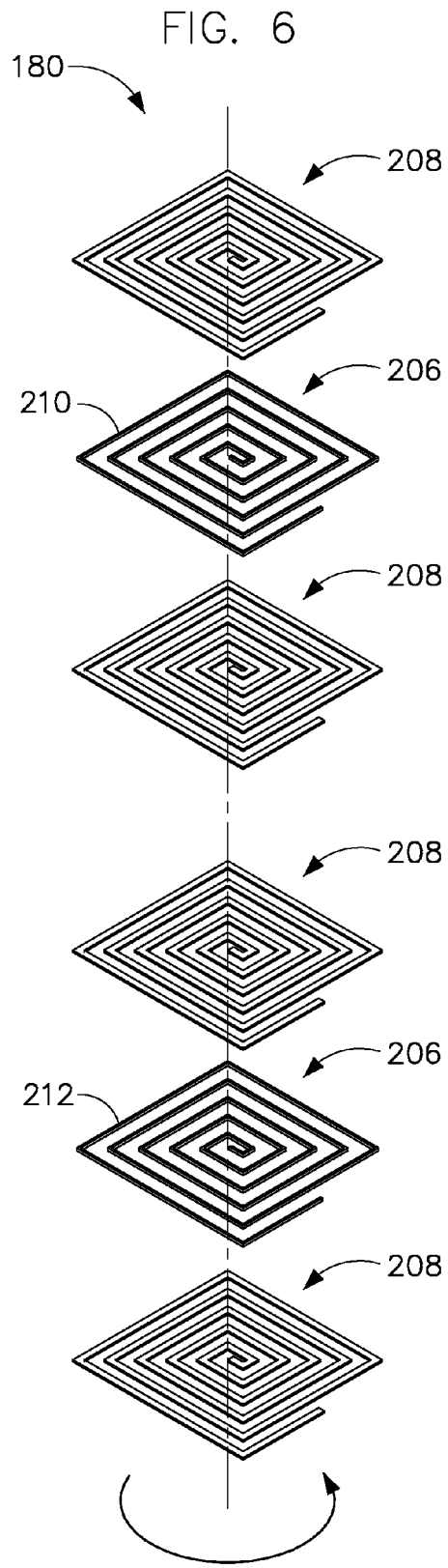

INVISIBLE BALUN AND METHOD OF MAKING SAME

BACKGROUND OF THE INVENTION

Embodiments of the invention relate generally to transmission lines and more particularly to a resonant balun used in transmission lines.

MRI coils may be single channel antennas or multiple channel phased array antennas. Phased array coils or antennas often need particular circuitry for transporting acquired signal for further processing. For example, in an effort to decouple the channels and the coils associated therewith of the phased array coils, impedance matching or bridging circuitry is often used. This circuitry may include a capacitor, inductor, and a low impedance preamplifier in a receiving loop to effectively create a resonance tank. Often, the use of such circuitry is referred to as preamplifier decoupling. Preamplifier decoupling can beneficially reduce current flow in a receive coil. As such, preamplifier decoupling techniques minimize cross-coupling between channels of a phased array coils.

Preamplifiers employed in matching circuitry often need a "clean" and unperturbed radio frequency (RF) ground reference. However, due to the close proximity between a preamplifier and a coil element, it can be difficult to obtain a clean and unperturbed RF ground reference. One matching technique for obtaining a relatively clean and unperturbed RF ground includes splitting a matching capacitor of the circuitry into two capacitors (the matching capacitor and the second capacitor) of a doubled capacitance and connecting a ground plane of a preamplifier to a so called "virtual" ground of the coil (e.g., a middle point between the matching capacitor and the second capacitor). To complete the match, an inductor is placed in series with an input of the preamplifier. A mathematical model, such as the Reykowski model known in the art, may be followed to allow for calculation or determination of the tuning and matching capacitors and inductance needed for preamp decoupling. Unfortunately, a virtual ground, as used in the matching technique discussed above, is generally not perfectly isolated and unperturbed. As such, the matching circuitry may be adversely affected.

To address such adverse effects arising from the use of a virtual ground in a matching circuit, a transmission line may be used with the preamplifier low input impedance for achieving inductor like characteristics. The transmission line itself often needs a balun to limit the sheath current. The balun represents an interval of a transmission line with high impedance on the common mode. In MR, where wavelength of the electromagnetic waves is longer that linear dimensions of the coil, the balun is built by creating a resonance tank on the outer shield of the transmission line. A typical transmission line, which needs a balun, is the coaxial cable whose topology includes three conducting paths for the RF current: the external surface of the central conductor, the internal surface of the conducting shield, and the external surface of the shield. This type of transmission line is "unbalanced" in contrast to a "balanced" transmission line. While in the Reykowski model, a classical inductor having impedance linearly dependent on frequency is required, the inductor-like behavior of a shortened transmission line is not a linear function of frequency. Instead, it is proportional to the characteristic impedance of the transmission line (for example, 50 Ohms) and tangential of the electrical length of the line. As such, the mathematical models such as the Reykowski model used to determine tuning and matching capacitance as well as determining inductance often yield only approximations. Further, the magnetic and electrical properties of the balun can also adversely affect the matching circuitry.

It would therefore be desirable to have a system and method capable of decoupling coil elements of an MR coil phase array in such a manner that allows for accurate mathematical modeling.

BRIEF DESCRIPTION OF THE INVENTION

In accordance with one aspect of the invention, a decoupling circuit includes a balun that comprises a transmission line. The transmission line includes a first spiral positioned substantially parallel to a first plane, the first spiral emanating from an inner portion of the first spiral in a first spiral direction. The transmission line also includes a second spiral positioned substantially parallel to the first plane, the second spiral emanating from a inner portion of the second spiral in the first spiral direction, wherein the inner portion of the first spiral is electrically coupled to the inner portion of the second spiral, and wherein the transmission line comprises a signal line and a ground line. The balun further comprises a first capacitor electrically coupled to the transmission line.

In accordance with another aspect of the invention, a device comprises an impedance matching circuit electrically coupleable to a first channel of a multiple channel phased array of magnetic resonance (MR) antennas. The impedance matching circuit includes a transmission line that comprises a first transmission line spiral positioned along a first plane and a second transmission line spiral positioned along a second plane that is parallel to the first plane, the second transmission line spiral having a spiral shape that substantially mirrors a spiral shape of the first transmission line spiral. The transmission line further includes a transmission line path from an inner portion of the first transmission line spiral to an inner portion of the second transmission line spiral, wherein the transmission line comprises a signal line and a ground path. The impedance matching circuit also includes a first capacitor coupled to the first and the second transmission line spirals.

In accordance with yet another aspect of the invention, a method of manufacturing an impedance matching device includes forming an inductor that comprises forming a first transmission line spiral along a first planar region and forming a second transmission line spiral along a second planar region parallel to the first planar region such that a shape of the second transmission line spiral substantially mirrors a shape of the first transmission line spiral, wherein a centroid region of the first transmission line spiral is electrically coupled to a centroid region of the second transmission line spiral, and wherein the first and the second transmission line spirals comprise a signal path and a ground path. The method also includes electrically coupling a capacitor to the ground path.

Various other features and advantages will be made apparent from the following detailed description and the drawings.

BRIEF DESCRIPTION OF THE DRAWINGS

The drawings illustrate embodiments presently contemplated for carrying out the invention.

In the drawings:

FIG. 4 is an isometric view of a portion of a six layer transmission line inductor according to an embodiment of the invention.

FIG. 5 is an exploded view of a circular spiral transmission line inductor according to an embodiment of the invention.

FIG. 6 is an exploded view of a rectangular spiral transmission line inductor according to an embodiment of the invention.

DETAILED DESCRIPTION

Figure 1:
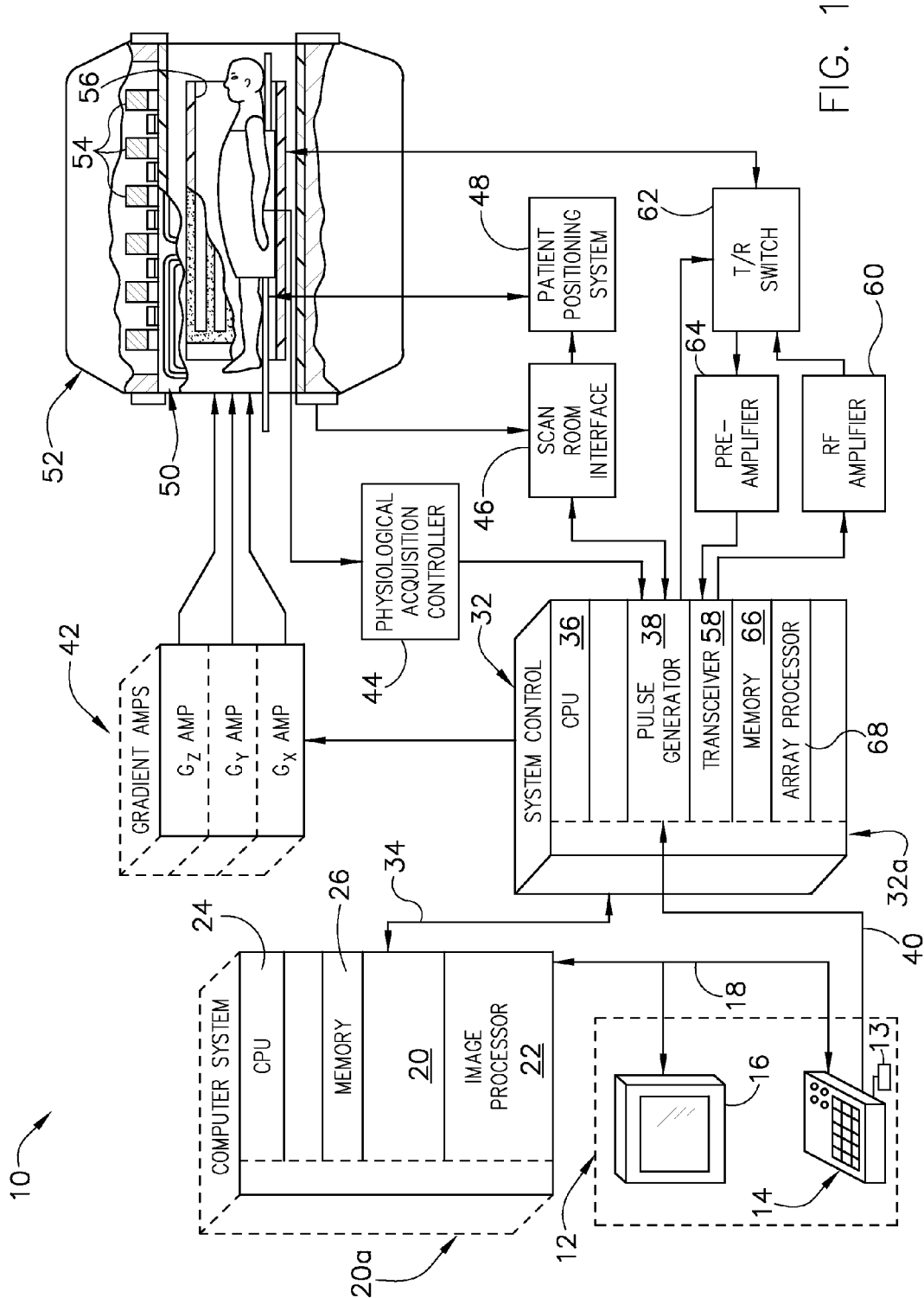
FIG. 1 is a schematic block diagram of an exemplary MR imaging system for use with embodiments of the invention.

Referring to FIG. 1, the major components of an exemplary magnetic resonance imaging (MRI) system 10 incorporating embodiments of the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26 that may include a frame buffer for storing image data arrays. The computer system 20 is linked to archival media devices, permanent or back-up memory storage or a network for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. In an embodiment of the invention, RF coil 56 is a multi-channel coil. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the multi-channel RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory. In response to commands received from the operator console 12, this image data may be archived in long term storage or it may be further processed by the image processor 22 and conveyed to the operator console 12 and presented on the display 16.

Figure 2:
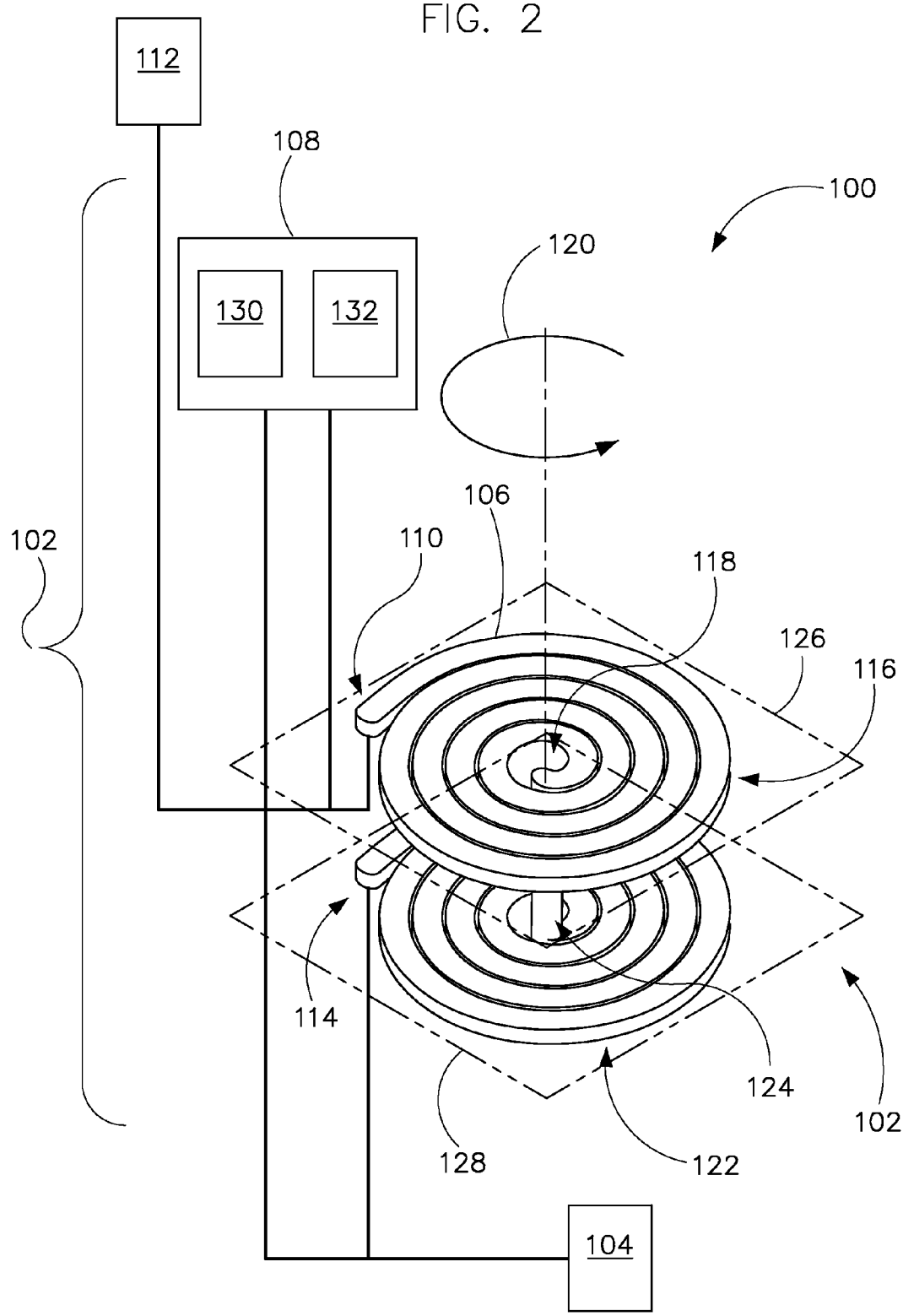
FIG. 2 is a schematic diagram of a resonant tank according to an embodiment of the invention.

Referring to FIG. 2, a schematic diagram a decoupling circuit 100 is shown according to an embodiment of the invention. Decoupling circuit 100 includes a resonant tank 102 and a preamplifier 104. Resonant tank 102 includes an inductor 106 and a capacitance system 108. A first end 110 of inductor 106 is coupled to a coil element 112 of a phased array (not shown) of MR coils, while a second end 114 of inductor 106 is coupled to preamplifier 104. Inductor 106 includes a first inductor spiral 116 emanating from a inner region 118 in a first spiral direction 120 and a second inductor spiral 122 also emanating from inner region 118 in first spiral direction 120. First inductor spiral 116 is coupled to second inductor spiral 122 by a coupling region 124.

First inductor spiral 116 of inductor 106 lies along a first plane 126 or planar region and second inductor spiral 122 lies along a second plane 128 or planar region that is substantially parallel to first plane 126. As such, first inductor spiral 116 is substantially parallel to second inductor spiral 122. Coupled in parallel with first and second inductor spirals 116, 120 is capacitance system 108. Capacitance system 108 includes a first capacitor 130 that may be a fixed or variable capacitor. It is contemplated that capacitance system 108 may also include a second capacitor 132 that may also be a fixed or variable capacitor coupled in series or in parallel with first capacitor 130.

Due in part to the double spiral shape of inductor 106, stray magnetic resonant fields outside inductor 106 are substantially reduced when the wavelength corresponding to the system frequency (e.g., of RF coil 56 of MRI system 10) is much greater (e.g., 10 times) than the linear dimensions of inductor 106. Accordingly, inductor 106 is effectively an invisible inductor 106 for magnetic excitation. In other words, any magnetic and/or electric field generated from inductor 106 is effectively confined within or between first and second inductor spirals 116, 120.

Figure 3:
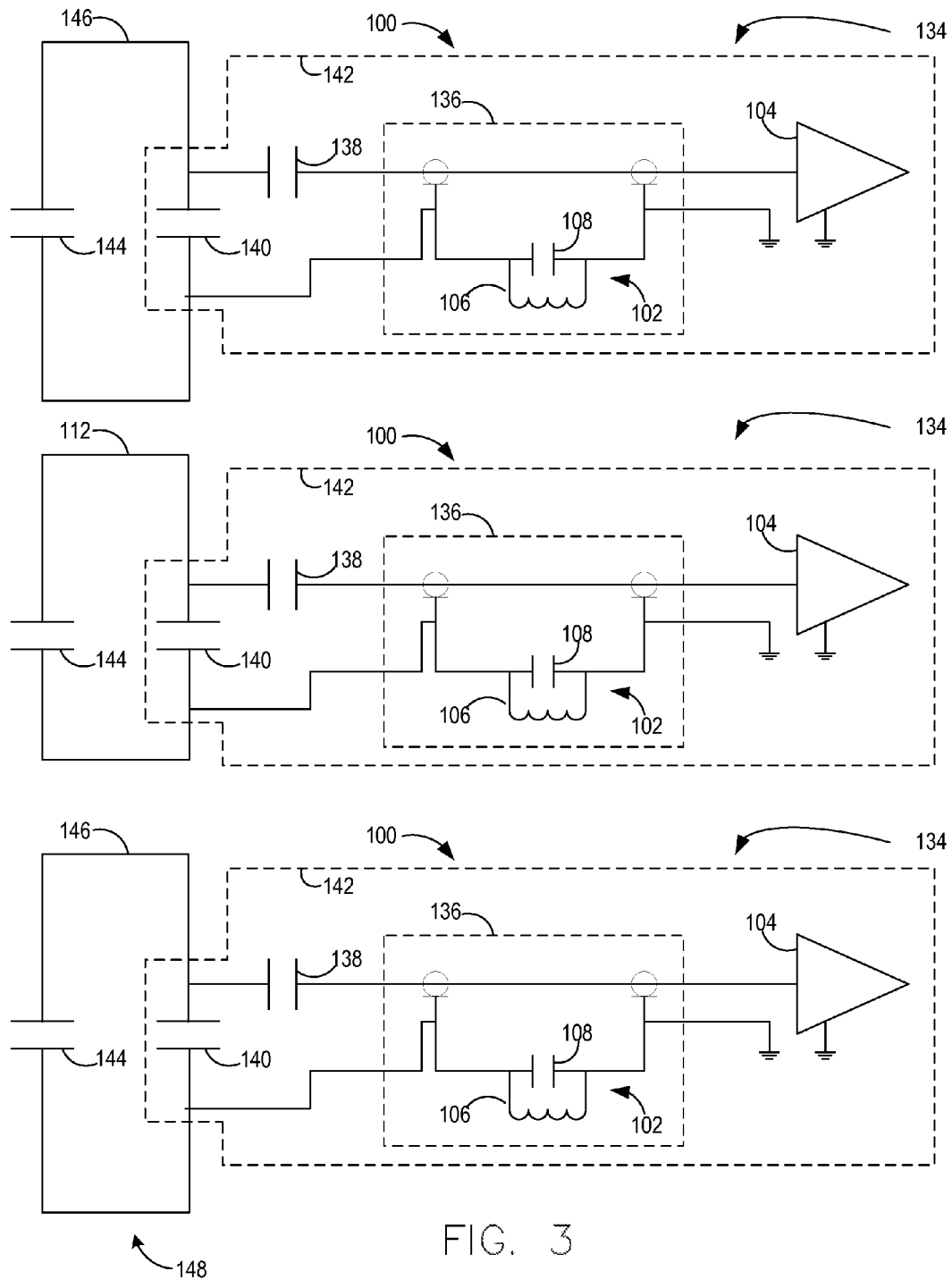
FIG. 3 is a schematic diagram representation of preamplifier decoupling of an RF coil array according to an embodiment of the invention.

Referring now to FIG. 3, a circuit diagram 134 representing decoupling circuit 100 and coil element 112 of FIG. 2 is shown according to an embodiment of the invention. Resonant tank 102 is part of a transmission line 136 coupling signals from coil element 112 to preamplifier 104. Preamplifier 104, transmission line 136, a predump capacitor 138, and a matching capacitor 140 may be coupled to a feedboard 142, to which coil element 112 and a tuning capacitor 144 are also coupled. Decoupling circuit 100 effectively decouples coil element 112 from other coil elements 146 part of a same MR coil phased array 148 that may be used with, for example, the MR system 10 of FIG. 1. It is contemplated that each coil element 112, 146 of MR coil phased array 148 would have a feedboard, such as feedboard 142, coupled thereto. As will be described below, inductor 106 has a low profile and may be incorporated in printed circuit layers (not shown) of feedboard 142. Inductor 106 can thus be manufactured in a substantially automated manner.

Referring to FIG. 4, a six-layer transmission line inductor 150 is shown according to an embodiment of the invention. Transmission line inductor 150 includes a first transmission line spiral 152 and a second transmission line spiral 154. First transmission line spiral 152 of transmission line inductor 150 includes a first set of spiral grounding elements 156 and a first spiral signal line 158 that lies between first spiral grounding elements 156. Though in practice, grounding elements 156 follow the path or substantially all of the path of first spiral signal line 158, only inner and outer portions of grounding elements 156 are shown for purposes of clarity. Second transmission line spiral 154 of transmission line inductor 150 includes a second set of spiral grounding elements 160 and a second spiral signal line 162 that lies between second set of grounding elements 160. Similar to the illustration of grounding elements 156, only inner and outer portions of grounding elements 160 are shown for purposes of clarity. That is, in practice, grounding elements 160 follow the path or substantially all of the path of second spiral signal line 162.

First set of spiral grounding elements 156 includes a first spiral grounding element 164 and a second spiral grounding element 166 with first spiral signal line 158 positioned therebetween. First spiral signal line 158, first spiral grounding element 164, and second spiral grounding element 166 each have substantially the same spiral shape that emanates from an inner region 168 of transmission line inductor 150 in a first spiral direction 170.

Second set of spiral grounding elements 160 includes a third spiral grounding element 172 and a fourth spiral grounding element 174 with second spiral signal line 162 positioned therebetween. As with first spiral signal line 158, first spiral grounding element 164, and second spiral grounding element 166, each of second spiral signal line 162, third spiral grounding element 172, and fourth spiral grounding element 174 emanate from inner region 168 of transmission line inductor 150 in first spiral direction 170. As such, first spiral grounding element 164, first spiral signal line 158, second spiral grounding element 166, third spiral grounding element 172, second spiral signal line 162, and fourth spiral grounding element 174 mirror each other.

As shown in FIG. 4, first spiral grounding element 164 is electrically coupled to second spiral grounding element 166 by a first set of coupling paths 176, and third spiral grounding element 172 is electrically coupled to fourth spiral grounding element 174 by a second set of coupling paths 178. Though first set of coupling paths 176 includes two conductive paths, it is contemplated that embodiments of the invention include less than two or more than two coupling paths that electrically couple first spiral grounding element 164 to second spiral grounding element 166. Likewise, though second set of coupling paths 178 includes two conductive paths, it is contemplated that embodiments of the invention include less than two or more than two conductive paths that electrically couple third spiral grounding element 172 to fourth spiral grounding element 174. In addition to first and second set of coupling paths 176, 178, and as will be discussed below with respect to FIG. 7, it is contemplated that, within inner region 168 of FIG. 3, first spiral grounding element 164 is coupled to fourth spiral grounding element 174, second spiral grounding element 166 is coupled to third spiral grounding element 172, and first spiral signal line 158 is coupled to second spiral signal line 162.

In addition, due to the coupling among first, second, third, and fourth spiral grounding elements 164, 166, 172, 174, these spiral grounding elements 164, 166, 172, 174 together form a ground line or path that proceeds through transmission line inductor 150. Further, due to the coupling among first spiral signal line 152 and second spiral signal line 154, first and second signal lines 152, 154 together form a signal line that proceeds through transmission line inductor 150.

As explained above with respect to inductor 106, due, in part, to the shape of transmission line inductor 150, stray magnetic resonant fields outside transmission line inductor 150 are substantially reduced when the wavelength corresponding to the system frequency is much greater than the linear dimensions of transmission line inductor 150 In other words, during use of transmission line inductor 150, the magnetic and electric fields generated therefrom essentially remain confined within the region between first and fourth spiral grounding elements 164, 174, respectively. Further, due in part to the shape of first and second sets of grounding elements 156, 160, respectively, signal conveyed along first and second spiral signal lines 158, 162, respectively, is protected from outside radiation, thus allowing for the conveyance of a "cleaner" signal from a coil element (e.g., coil element 112 of FIG. 2) to a preamplifier (e.g., preamplifier 104 of FIG. 2).

Referring to FIG. 5, an exploded view of an inductor-like transmission line 180 having a signal line 182 and a plurality of corresponding grounding paths 184 is shown according to an embodiment of the invention. Similar to FIG. 3, signal line 182 of FIG. 5 includes a first spiral signal line 186 and a second spiral signal line 188. It is noted that first spiral signal line 186 is coupled to second spiral signal line 188 via a conductive path (not shown). Further details regarding the coupling between first and second spiral signal lines 186, 188 will be set forth below with respect to FIG. 7.

Also similar to FIG. 3, grounding path 184 of FIG. 5 of transmission line 180 include a first grounding element 190, a second grounding element 192, a third grounding element 194, and a fourth grounding element 196. Though not shown in FIG. 3, it is to be understood that first grounding element 190 is coupled to fourth grounding element 196, second grounding element 192 is coupled to third grounding element 194, first grounding element 190 is coupled to second grounding element 192 (see, for example, first set of coupling paths 176 of FIG. 3), and third grounding element 194 is coupled to fourth grounding element 196 (see, for example, second set of coupling paths 178 of FIG. 3) as described in embodiments herein. Each grounding element 190-196 and each spiral signal line 186, 188 of transmission line 180 have the same spiral shape. As such, each spiral (i.e., grounding elements 190-196 and spiral signal lines 186-188 of transmission line 180) emanate from an inner spiral region 198 in a first spiral direction 200 relative to an imaginary axis 202 through each inner spiral region 198.

Referring to FIG. 6, an exploded view of an transmission line 204 having a mirroring set of spiral signal lines 206 and a plurality of corresponding grounding elements 208 is shown according to an embodiment of the invention. Similar to transmission line 180 of FIG. 3, signal line 206 of transmission line 204 of FIG. 6 includes a first spiral signal line 210 and a second spiral signal line 212. Like grounding elements 184 of FIG. 4 and spiral signal lines 186, 188 thereof, grounding elements 208 and each spiral signal line 210, 212 of FIG. 6 have the same spiral shape. However, rather than having an elliptical or circular spiral shape, signal trace spirals 210, 212 and grounding elements 208 have a rectangular spiral shape. Other spiral shapes are also contemplated.

Figure 7:
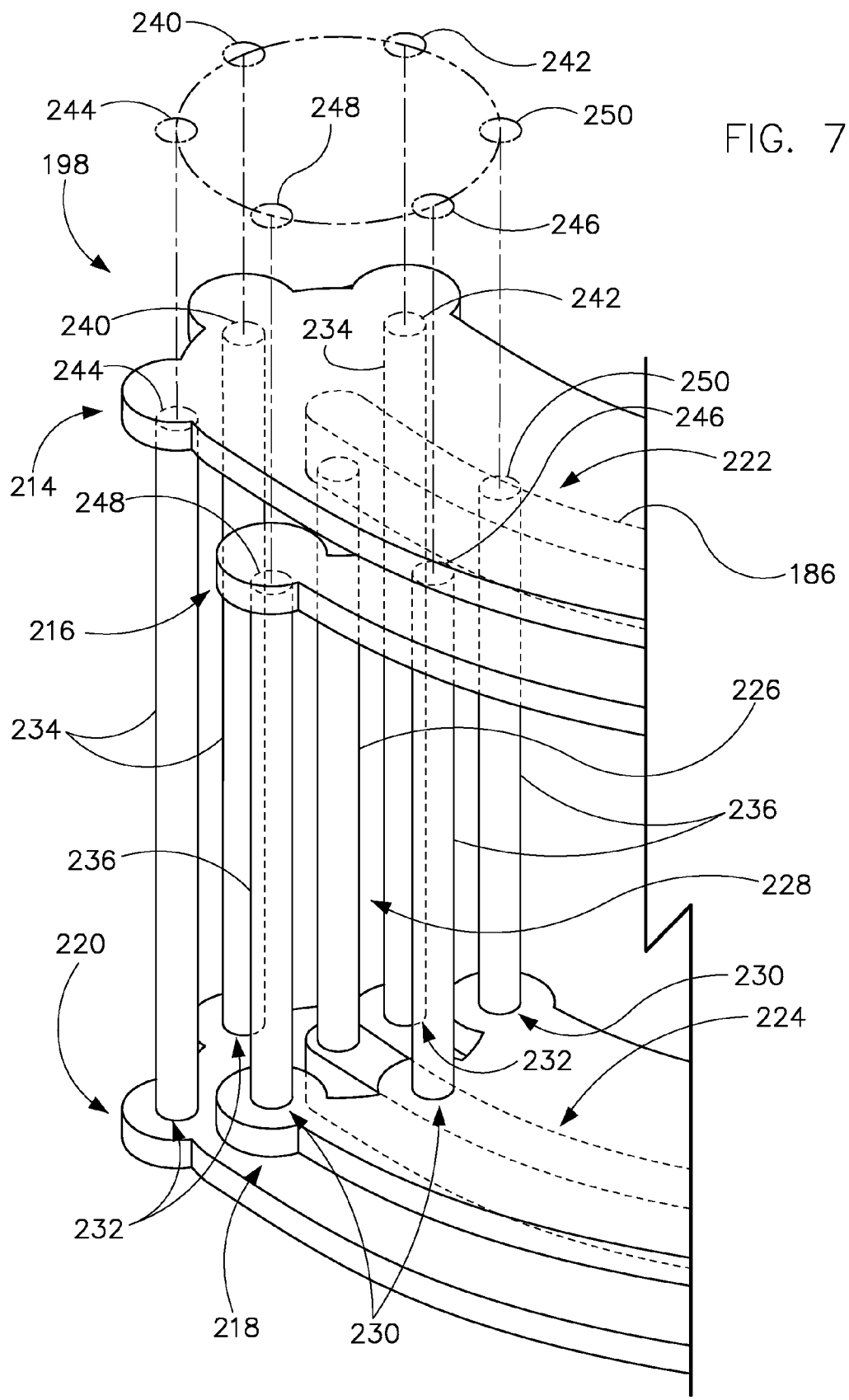
FIG. 7 is an isometric view of coupling among transmission line inductor components of FIG. 5 according to an embodiment of the invention.

Referring to FIG. 7, a perspective view of the coupling among inner regions 198 of grounding elements 184 of FIG. 5 and the coupling among inner regions 198 of spiral signal lines 186, 188 of transmission line 180 of FIG. 5 is shown according to an embodiment of the invention. At least a portion of inner region 198 of each grounding element 184 is shown. That is, an inner region 214 of first grounding element 190, an inner region 216 of second grounding element 192, an inner region 218 of third grounding element 194, and an inner region 220 of fourth grounding element 196 are shown. Also shown is an inner region 222 of first spiral signal line 186 and an inner region 224 of second spiral signal line 188.

Inner region 222 of first spiral signal line 186 is coupled to inner region 224 of second spiral signal line 188 via a conductive path 226. It is contemplated that conductive path 226 of FIG. 7 includes a conductive material that at least partially fills or coats the sides of a first via 228, which runs between inner region 222 of first spiral signal line 186 and inner region 224 of second spiral signal line 188. To aid in the confinement of any magnetic and/or electrical fields that may emanate from transmission line 180, inner region 214 of first grounding element 190 is coupled to inner region 220 of fourth grounding element 196 with a first plurality of conductive or ground paths 230. Similarly, inner region 216 of second grounding element 192 is coupled to inner region 218 of third grounding element 194 with a second plurality of conductive paths 232.

In the present embodiment, first plurality of conductive paths 230 proceeds down a first set of three vias 234, and second plurality of conductive paths 232 proceeds down a second set of three vias 236. Each via 234, 236 is coated or at least partially filled with a conductive material. Though it is preferred that first plurality of conductive paths 230 includes three conductive paths and second plurality of conductive paths 232 includes three conductive paths, it is contemplated that each plurality of conductive paths 230, 232 may include more or less than three conductive paths. However, reflections are minimized when each plurality of conductive paths 230, 232 includes three conductive paths.

In the present embodiment, projections of vias 234, 236 lie on an imaginary circle 238. That is, positions of first set of vias 234 are represented by a first via position 240, a second via position 242, and a third via position 244 about circle 238. In a similar manner, positions of second set of vias 236 are represented by a fourth via position 246, a fifth via position 248, an sixth via position 250 about circle 238. Further details regarding via positions. 240-250 will be set forth below with respect to FIG. 13.

Though FIG. 7 in conjunction with FIG. 5 depicts coupling among grounding elements 190-196 within inner region 198, it will be appreciated that additional couplings, such as couplings 176, 178 of FIG. 3 may occur among grounding elements 190-196 of FIG. 5 outside inner region 198 along other portions of grounding elements 190-196 in accordance with transmission line theory practice.

Figures 8, 9:
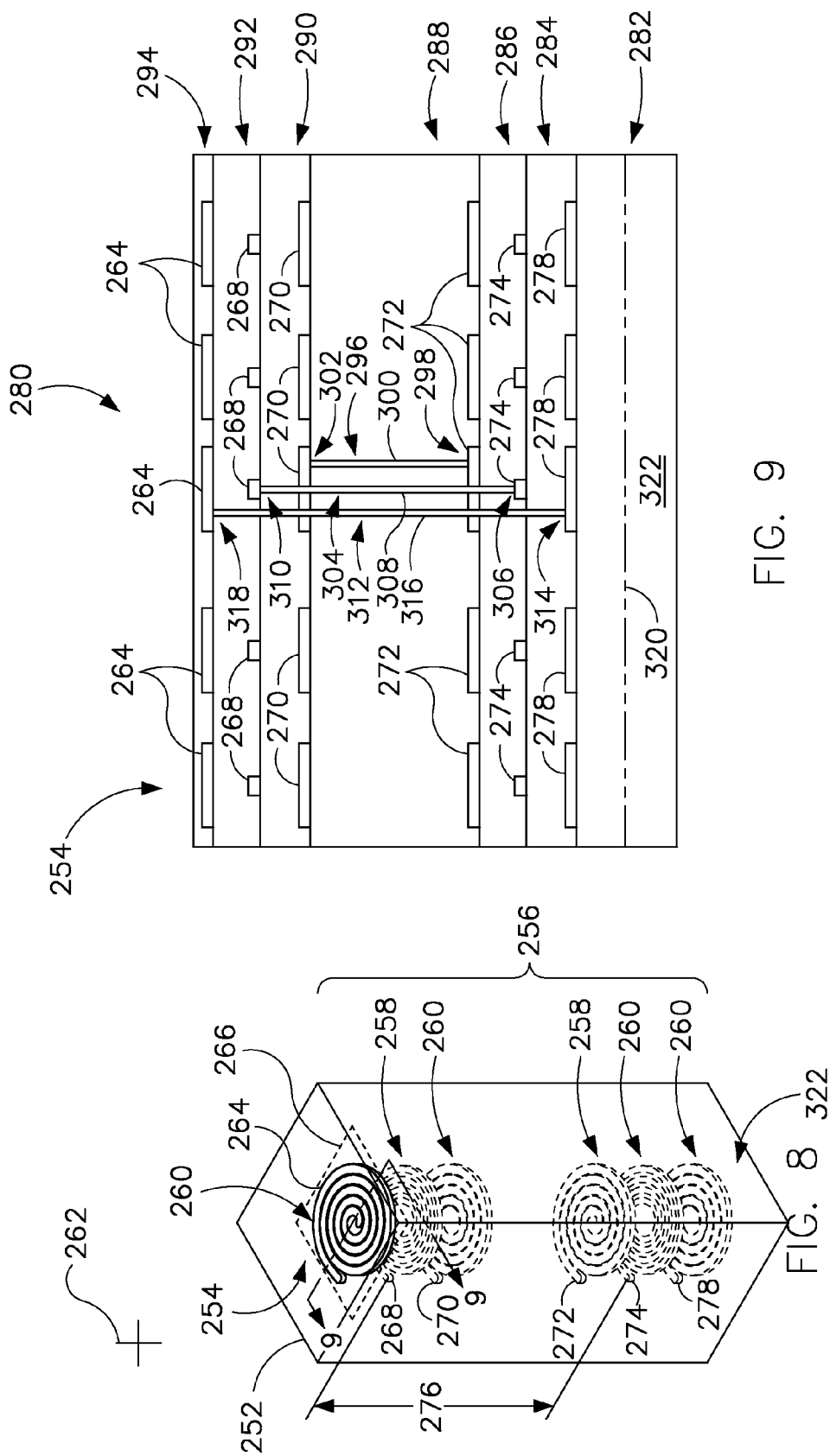
FIG. 8 is an isometric view of a printed circuit board according to an embodiment of the invention.
FIG. 9 is a cross-sectional view of the printed circuit board of FIG. 8 taken along line 9-9 of FIG. 8.

Referring to FIG. 8, a perspective view of a portion of a printed circuit board (PCB) 252 having an inductor 254 incorporated thereinto is shown according to an embodiment of the invention. PCB 252 includes a transmission line 256 having a signal line 258 and a ground line or path comprising a plurality of grounding elements 260. From a top-view 262, a first grounding element 264 having a spiral shape 266 is shown. Below first grounding element 264 is a first spiral signal line 268 of signal line 258. First signal line spiral has a spiral shape (not shown) that substantially mirrors spiral shape 266 of first grounding element 264 and is substantially parallel thereto. Below first spiral signal line 268 is a second grounding element 270. Second grounding element 270 also has a spiral shape (not shown) that substantially mirrors spiral shape 266. Below second grounding element 270 is a third grounding element 272. Third grounding element 272 also has a spiral shape (not shown) that substantially mirrors spiral shape 266.

Below third grounding element 272 is a second signal spiral line 274 of signal line 258. Like first spiral signal line 268 second spiral signal line 274 has a spiral shape (not shown) that substantially mirrors spiral shape 266. In one embodiment, a spacing 276 of one millimeter exists between first and second spiral signal lines 268, 274 of signal line 258. However, others spacings are contemplated.

Below second spiral signal line 274 of signal line 258 is a fourth grounding element 278 that has a shape (not shown) that substantially mirrors spiral shape 266. It is contemplated that first and fourth grounding elements 264, 278 are electrically coupled together, second and third grounding elements 270, 272 are electrically coupled together, and first and second spiral signal lines 268, 274 of signal trace 258 are also electrically coupled together in a manner similar to the coupling described with respect to FIG. 7. In addition, it is contemplated that first grounding element 264 is electrically coupled to second grounding element 270 (see, for example, first set of coupling paths 176 of FIG. 3) and that third grounding element 272 of FIG. 8 is electrically coupled to fourth grounding element 278 (see, for example, second set of coupling paths 178 of FIG. 3).

Referring now to FIGS. 8 and 9, a cross-sectional view 280 of inductor 254 along a line 9-9 of FIG. 8 of PCB 252 is shown in FIG. 9 according to an embodiment of the invention. As depicted in FIG. 9, fourth grounding element 278 lies atop a first dielectric layer 282. Fourth grounding element 278 may be deposited onto first dielectric layer 282 by deposition, sputtering, or another printed circuit board manufacturing method. After a second dielectric layer 284 is deposited or placed over fourth grounding element 278 and first dielectric layer 282, second spiral signal line 274 of signal line 258 is manufactured onto second dielectric layer 284. In series, a third dielectric layer 286, third grounding element 272, and a fourth dielectric layer 288 are manufactured atop second dielectric layer 284. Second grounding element 270 is then manufactured onto fourth dielectric layer 288. An inductance of inductor 254 may be modified by varying a thickness of fourth dielectric layer 288. In this manner, the inductance of inductor 254 may be tailored to a desired value.

Next, a fifth dielectric material 290 is then deposited or positioned onto second grounding element 270 and fourth dielectric layer 288. First spiral signal line 268 of signal line 258 is manufactured onto fifth dielectric layer 290. After manufacturing first spiral signal line 268 of signal line 258 onto fifth dielectric layer 290, a sixth dielectric layer 292 is manufactured over first spiral signal line 268 and fifth dielectric layer 290. First grounding element 264 is then manufactured onto sixth dielectric layer 292. Next, a seventh layer 294 such as a solder mask layer may be deposited or positioned over first grounding element 264 and sixth dielectric layer 292. It is contemplated that each dielectric layer 282-288, 290, 292 is composed of a material suitable for PCB manufacture such as FR4 or a ceramic-based dielectric material. However, it is preferred that the dielectric material be less lossy than FR4.

During the manufacture of transmission line 256, a first via 296 is formed through fourth dielectric layer 288 to an inner region 298 of third grounding element 272, which is coated or filled with a first electrically conductive material 300. Accordingly, an inner region 302 of second ground element 270 is electrically coupled to inner region 298 of third grounding element 272 by conductive material 300. While not shown in FIG. 9, it is to be understood that other vias are created according to embodiments of the invention that proceed through fourth dielectric layer 288 between inner region 298 of third ground element 272 and inner region 302 of second grounding element 270 and are coated or filled with a electrically conductive material such as conductive material 300.

In addition to the manufacture of first via 296 and the conductive material 300 therein, a second via 304 is manufactured through dielectric layers 286-290 to an inner region 306 of second spiral signal line 274 of signal trace 258. Second via 304 is coated or filled with a second electrically conductive material 308, which may be the same as or different than first electrically conductive material 300. Accordingly, an inner region 310 of first spiral signal line 268 is electrically coupled to inner region 306 of second spiral signal line 274. It is to be understood that other vias and conductive paths are formed through fifth, fourth and third dielectric layers 290, 288, 286, respectively, to electrically couple inner region 310 of first spiral 268 to inner region 306 of second spiral 274.

The manufacture of transmission line 256 also includes the formation of a third via 312 through dielectric layers 284-292 to an inner region 314 of fourth ground element 278. Similar to first and second vias 296, 304, third via 312 is coated or filled with a third conductive material 316. Accordingly, an inner region 318 of first grounding element 264 is electrically coupled to inner region 314 of fourth grounding element 278. It is contemplated, however, that additional vias (not shown) may be formed from first grounding element 264 to fourth grounding element 278 and filled or coated with conductive material. Therefore, it is contemplated that additional conductive paths (not shown) may be formed to electrically couple first grounding element 264 to fourth grounding element 278.

As depicted in FIG. 9, grounding elements 264, 270, 272, 278 and spiral signal lines 268, 274 are positioned or deposited in an overlapping manner.

It is contemplated that a ground plane 320 (shown in phantom) may be incorporated into PCB 252. In such an instance, first dielectric layer 282 would include an additional dielectric layer 322.

Figure 11:
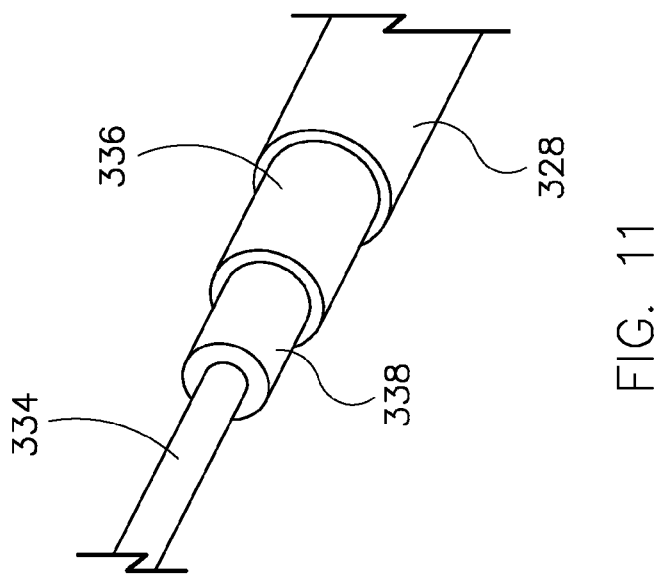
FIG. 11 is a cutaway view of the coaxial cable of FIG. 10 according to an embodiment of the invention.
Figure 10:
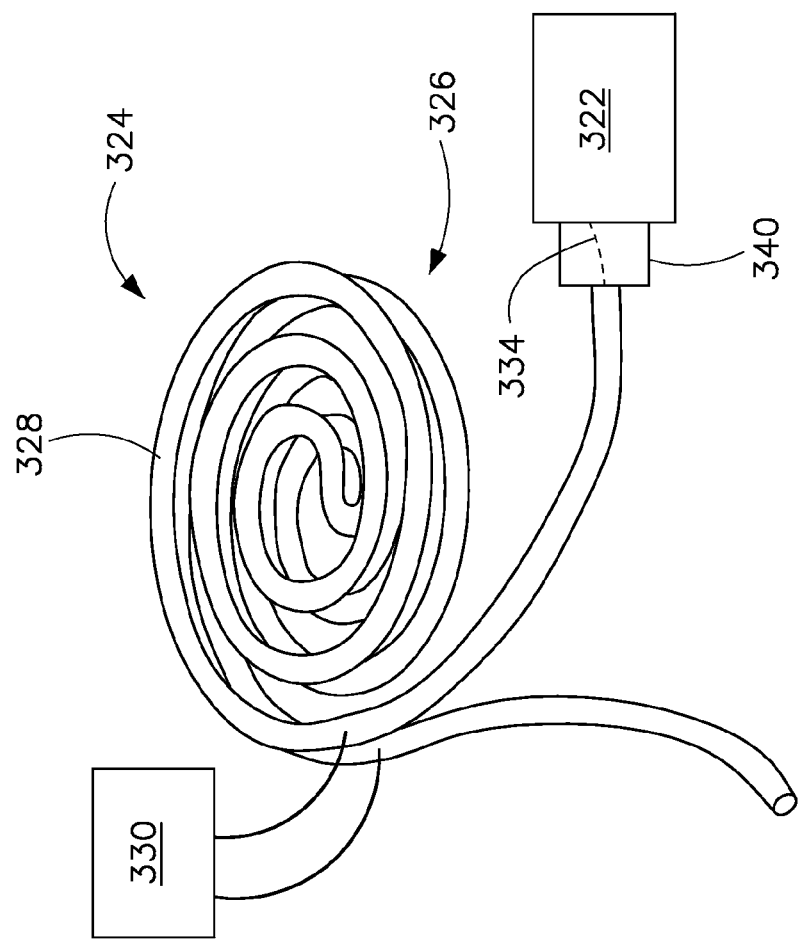
FIG. 10 is an isometric view of a balun made out of coaxial cable according to an embodiment of the invention.

Referring now to FIG. 10, a schematic diagram of a decoupling circuit 324 is shown according to an embodiment of the invention. Decoupling circuit 324 includes a balun 326 including a coaxial cable 328, which serves as a transmission line, and a capacitance system 330. Decoupling circuit 324 also includes a preamplifier 332 coupled to balun 326. FIG. 11 depicts a schematic diagram of a cut-away view of coaxial cable 328 according to an embodiment of the invention. Referring to FIGS. 10 and 11, an inner core 334 of coaxial cable 328 forms the signal trace of balun 326 and a metallic shield 336 of coaxial cable 328 serves as a ground of balun 326. A dielectric material 338 electrically isolates inner core 334 from metallic shield 336. Metallic shield 336 of balun 326 is coupled to a preamplifier ground 340 of preamplifier 332, and inner core 334 of balun 326 is coupled to preamplifier 332. Metallic shield 336 is also coupled to capacitance system 330, effectively creating a resonance tank.

Figure 12:
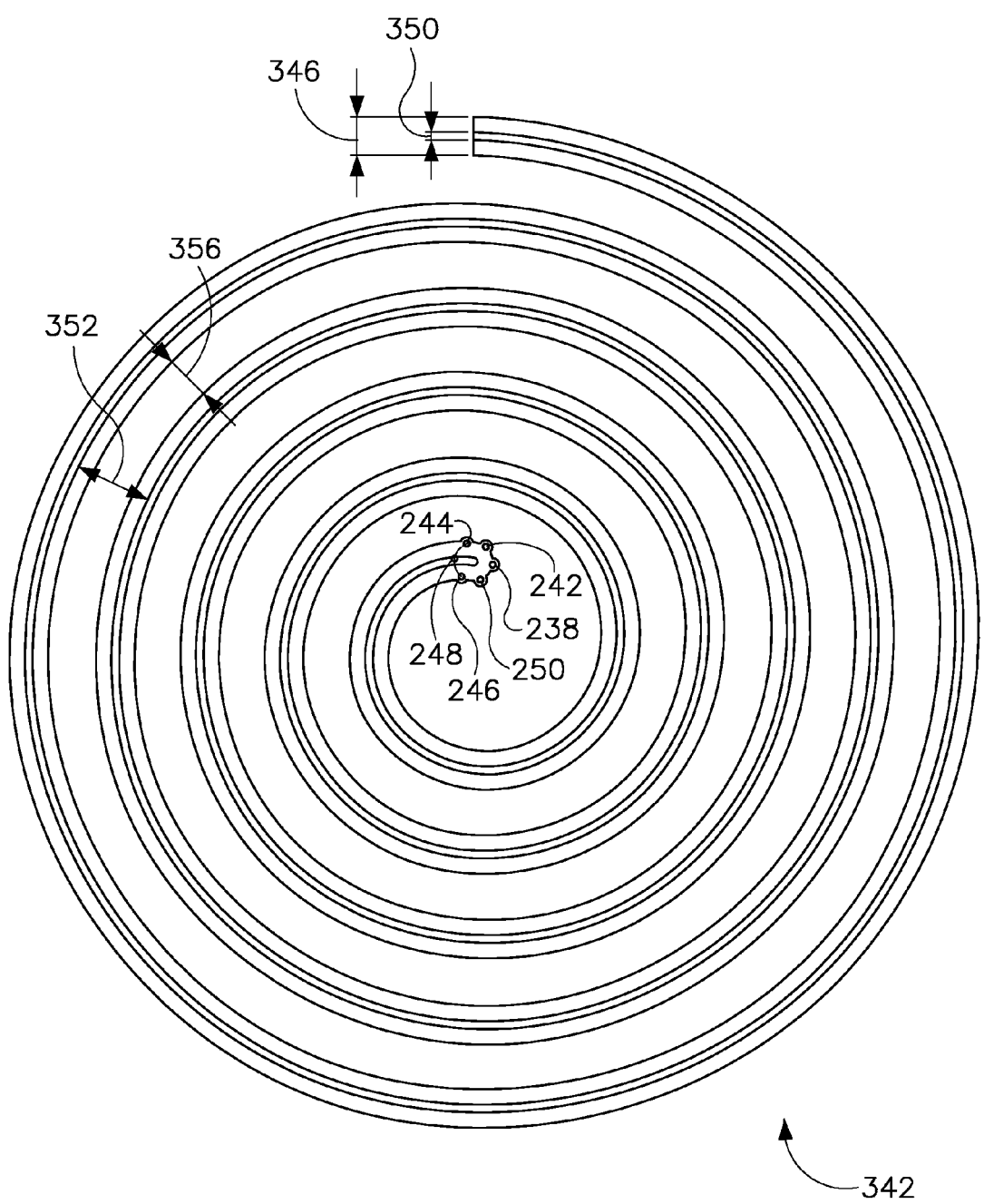
FIG. 12 is a top-view of a transmission line inductor according to an embodiment of the invention.

Referring to FIG. 12, a top view of a transmission line 342 is shown according to an embodiment of the invention. A grounding element 344 is shown having a ground element width 346. Though not shown, it is contemplated that the remaining ground elements (e.g., grounding elements 270, 272, 278 of FIG. 8) have substantially the same width as ground element width 346 of FIG. 12. A portion of a signal line 348 is also shown in hidden lines. Signal line 348 has a signal line width 350, and there is a signal trace gap 352 that arises as the distance from an origin 354 increases. A gap 356 between successive spirals of ground element 344 is also shown.

A spiral balun length, such as the length of balun 342, may be determined in a number of ways. One method for determining spiral balun length is set forth below.

First, transmission line input variables are set to the following:

L=total length of transmission line,
$W_G$=width of ground element,
W=Signal line width,
$W_{Gap}$=width of gap between signal lines,
$R_0$=starting radius (e.g., radius from $\pi$ to $3\pi/2$),
$\phi_0$=spiral slope from $\pi$ to $3\pi/2$=$s_0$=$(W_G+6W_{Gap})/2\pi$,
$\phi_1$=spiral slope after $3\pi/2$ =$s_1$=$(W_G+W_{Gap})/2\pi$.

The basic topology of the inductor-type transmission lines according to embodiments of the invention comprises an Archimedes spiral. As such:

$$R_{central}^0(\phi)=R^0+s_0(\phi-\phi_1) \quad \text{(Eqn. 2),}$$

$$R_{central}^1(\phi)=R_{central}^0(\phi_1)+s_1(\phi-\phi_1) \quad \text{(Eqn. 3), and}$$

$$R_{central}(\phi)=R_{central}^0(\phi), \phi_1 \leq \phi < \phi_1 \text{ and } R_{central}(\phi), \phi_1 \leq \phi < \phi_f \quad \text{(Eqn. 4).}$$

In Cartesian coordinates, this reads as:

$$x_{central}(\phi)=R_{central}(\phi)\cos(\phi) \quad \text{(Eqn. 5), and}$$

$$y_{central}(\phi)=R_{central}(\phi)\sin(\phi) \quad \text{(Eqn. 6).}$$

External boundaries of the spirals are:

$$R_{central}^{in}(\phi)=R_{central}(\phi)-W/2 \quad \text{(Eqn. 7),}$$

with $$x_{signal}^{in}(\phi)=R_{signal}^{in}(\phi)\cos(\phi) \quad \text{(Eqn. 8), and}$$

$$y_{signal}^{in}(\phi)=R_{signal}^{in}(\phi)\sin(\phi) \quad \text{(Eqn. 9),}$$

and $$R_{central}^{out}(\phi) = R_{central}(\phi) + W/2 \quad \text{(Eqn. 10)},$$

with $$x_{signal}^{out}(\phi) = R_{signal}^{out}(\phi)\cos(\phi) \quad \text{(Eqn. 11), and}$$

$$y_{signal}^{out}(\phi) = R_{signal}^{out}(\phi)\sin(\phi) \quad \text{(Eqn. 12)},$$

and $$R_{ground}^{in}(\phi) = R_{central}(\phi) - W_G/2 \quad \text{(Eqn. 13)},$$

with $$x_{ground}^{in}(\phi) = R_{ground}^{in}(\phi)\cos(\phi) \quad \text{(Eqn. 14), and}$$

$$y_{ground}^{in}(\phi) = R_{ground}^{in}(\phi)\sin(\phi) \quad \text{(Eqn. 15)},$$

and $$R_{ground}^{out}(\phi) = R_{central}(\phi) + W_G/2 \quad \text{(Eqn. 16)},$$

with $$x_{ground}^{out}(\phi) = R_{ground}^{out}(\phi)\cos(\phi) \quad \text{(Eqn. 17), and}$$

$$y_{ground}^{out}(\phi) = R_{ground}^{out}(\phi)\sin(\phi) \quad \text{(Eqn. 18)}.$$

Spiral length may then be calculated by integrating the elementary interval of the arc length follows:

$$\Delta l^2 = (\partial x/\partial \phi)^2 \Delta \phi^2 + (\partial y/\partial \phi)^2 \Delta \phi^2 \quad \text{(Eqn. 19)}$$

If it is defined that:

$$R_{central}(\phi) = R^0 + s(\phi - \phi_1) \quad \text{(Eqn. 20)},$$

$$x(\phi) = R_{central}(\phi)\cos(\phi) \quad \text{(Eqn. 21), and}$$

$$y(\phi) = R_{central}(\phi)\sin(\phi) \quad \text{(Eqn. 22)},$$

then $$\Delta l^2 = [R_0^2 + 2R_0 s(\phi - \phi_0) + s^2(1 + (\phi - \phi_0)^2)]\Delta \phi^2 \quad \text{(Eqn. 23)}.$$

If $f(R_0, s, \Delta\phi)$ is defined according to the following function:

$$f(R_0, s, \Delta\phi) = [R_0^2 + 2R_0 s \Delta\phi + s^2(1 + \Delta\phi^2)]^{1/2} \quad \text{(Eqn. 24)},$$

then the length of one Archimedes spiral between angle $\phi_0$ and $\phi_1$ will be:

$$l = \{(R_0 + s(\phi_1 + \phi_0))f(R_0, s, \phi_1 - \phi_0) - R_0\sqrt{(R_0^2 + s^2)} + s^2 \ln[(R_0 + s(\phi_1 - \phi_0) + f(R_0, s, \phi_1 - \phi_0))/(R_0\sqrt{(R_0^2 + s^2)})]\}/2s \quad \text{(Eqn. 25)}.$$

As discussed above with respect to FIG. 7, projections of vias 240-250 fall onto circle 238. With respect to FIG. 12, circle 238 is shown with via positions 240-250. Via positions may be defined by a variety of methods. For example, in one embodiment, via positions 240-250 are determined in the manner set forth below.

Circle equations for spirals starting at their origins are defined as follows:

$$x_{signal}^{circ}(\beta) = x_{center}(\phi_0) + (W/2)\cos\beta \quad \text{(Eqn. 26)},$$

$$y_{signal}^{circ}(\beta) = (w/2)\sin\beta \quad \text{(Eqn. 27)},$$

$$x_{groundOut}^{circ}(\beta) = x_{center}(\phi_0) + (W_G/2)\cos\beta \quad \text{(Eqn. 28)},$$

$$y_{groundOut}^{circ}(\beta) = (W_G/2)\sin\beta \quad \text{(Eqn. 29)},$$

$$x_{groundIn}^{circ}(\beta) = x_{center}(\phi_0) + (W_G/2)\cos\beta \quad \text{(Eqn. 30), and}$$

$$y_{groundIn}^{circ}(\beta) = -(W_G/2)\sin\beta \quad \text{(Eqn. 31)}.$$

An intersection point of the inside spiral of the ground element (e.g., ground element 344) and the ground circle (e.g., circle 238) given by point P can be calculated as a solution to the following system of equations:

$$x_{ground}^{in}(\phi_p) = x_{groundIn}^{circ}(\phi_p) \quad \text{(Eqn. 32), and}$$

$$y_{ground}^{in}(\phi_p) = y_{groundIn}^{circ}(\phi_p) \quad \text{(Eqn. 33)},$$

with the solution going to $(\phi_p, \Phi_p)$.

Accordingly, via positions 240-250 about circle 238 may be determined using Eqns. 34-39 listed below:

$$\Phi_A^0 = \pi - [(\pi + \phi_p)/2] \quad \text{(Eqn. 34)},$$

$$\Phi_A^1 = \Phi_A^0 + (\pi/3) \quad \text{(Eqn. 35)},$$

$$\Phi_A^{-1} = \Phi_A^0 - (\pi/3) \quad \text{(Eqn. 36)},$$

$$\Phi_B^{-1} = \pi - [(\pi - \phi_p)/2] \quad \text{(Eqn. 37)},$$

$$\Phi_B^1 = \Phi_B^0 + (\pi/3) \quad \text{(Eqn. 38), and}$$

$$\Phi_B^{-1} = \Phi_B^0 - (\pi/3) \quad \text{(Eqn. 39)},$$

where $\Phi_A^0$ represents a first angular via position 240, $\Phi_A^1$ represents a second angular via position 242, $\Phi_A^{-1}$ represents a third angular via position 244, $\Phi_B^0$ represents a fourth angular via position 246, $\Phi_B^1$ represents a fifth angular via position 248, $\Phi_B^{-1}$ represents a sixth angular via position 250, and $\phi_p$ represents.

In accordance with one embodiment of the invention, a decoupling circuit includes a balun that comprises a transmission line. The transmission line includes a first spiral positioned substantially parallel to a first plane, the first spiral emanating from a inner portion of the first spiral in a first spiral direction. The transmission line also includes a second spiral positioned substantially parallel to the first plane, the second spiral emanating from a inner portion of the second spiral in the first spiral direction, wherein the inner portion of the first spiral is electrically coupled to the inner portion of the second spiral, and wherein the transmission line comprises a signal line and a ground line. The balun further comprises a first capacitor electrically coupled to the transmission line.

In accordance with another embodiment of the invention, a device comprises an impedance matching circuit electrically coupleable to a first channel of a multiple channel phased array of magnetic resonance (MR) antennas. The impedance matching circuit includes a transmission line that comprises a first transmission line spiral positioned along a first plane and a second transmission line spiral positioned along a second plane that is parallel to the first plane, the second transmission line spiral having a spiral shape that substantially mirrors a spiral shape of the first transmission line spiral. The transmission line further includes an transmission line path from an inner portion of the first transmission line spiral to an inner portion of the second transmission line spiral, wherein the transmission line comprises a signal line and a ground path. The impedance matching circuit also includes a first capacitor coupled to the first and the second transmission line spirals.

In accordance with yet another embodiment of the invention, a method of manufacturing an impedance matching device includes forming an inductor that comprises forming a first transmission line spiral along a first planar region and forming a second transmission line spiral along a second planar region parallel to the first planar region such that a shape of the second transmission line spiral substantially mirrors a shape of the first transmission line spiral, wherein a centroid region of the first transmission line spiral is electrically coupled to a centroid region of the second transmission line spiral, and wherein the first and the second transmission line spirals comprise a signal path and a ground path. The method also includes electrically coupling a capacitor to the ground path.

The present invention has been described in terms of the preferred embodiments, and it is recognized that equivalents, alternatives, and modifications, aside from those expressly stated, are possible and within the scope of the appending claims.

What is claimed is:

1. A decoupling circuit comprising:
    a balun comprising:
        a transmission line comprising:
            a first spiral positioned substantially parallel to a first plane, the first spiral emanating from a inner portion of the first spiral in a first spiral direction;
            a second spiral positioned substantially parallel to the first plane, the second spiral emanating from a inner portion of the second spiral in the first spiral direction, wherein the inner portion of the first spiral is electrically coupled to the inner portion of the second spiral, and wherein the transmission line comprises a signal line and a ground line; and
        a first capacitor electrically coupled to the transmission line.

2. The decoupling circuit of claim 1 wherein the first spiral overlaps the second spiral.

3. The decoupling circuit of claim 1 wherein the balun is coupled to a printed circuit board.

4. The decoupling circuit of claim 1 further comprising:
    a first printed circuit board dielectric layer coupled to the first spiral; and
    a second printed circuit board dielectric layer coupled to the second spiral.

5. The decoupling circuit of claim 1 wherein the first and the second spiral comprises a single continuous coaxial cable.

6. The decoupling circuit of claim 1 wherein the ground line comprises:
    a first ground element having a shape substantially congruent to a shape of the first spiral a central portion corresponding to the central portion of the first spiral;
    a second ground element having a shape substantially congruent to the shape of the first spiral, the second ground element having a central portion corresponding to the central portion of the first spiral;
    a third ground element having a shape substantially congruent to a shape of the second spiral, the third ground element having a central portion corresponding to the central portion of the second spiral; and
    a fourth ground element having a shape substantially congruent to the shape of the second spiral, the fourth ground element having a portion corresponding to the central portion of the second spiral; and
    wherein the signal line is positioned between the first and the second ground elements and wherein the second spiral of the transmission line is positioned between the third and the fourth ground elements.

7. The decoupling circuit of claim 6 wherein the first capacitor, in being coupled to the transmission line, is coupled to at least one of the first and second ground elements and at least one of the third and fourth ground elements.

8. The decoupling circuit of claim 6 further comprising:
    a first plurality of vias coupling the central portions of the first and fourth ground elements together; and
    a second plurality of vias coupling the central portions of the second and third ground elements together.

9. The decoupling circuit of claim 8 wherein the first plurality of vias comprises less than four vias and wherein the second plurality of vias comprises less than four vias.

10. The decoupling circuit of claim 1 further comprising a preamplifier coupled to the first spiral.

11. A apparatus comprising:
    an impedance matching circuit electrically coupleable to a first channel of a multiple channel phased array of magnetic resonance (MR) antennas, the impedance matching circuit comprising:
        a transmission line comprising:
            a first transmission line spiral positioned along a first plane;
            a second transmission line spiral positioned along a second plane that is parallel to the first plane, the second transmission line spiral having a spiral shape that substantially mirrors a spiral shape of the first transmission line spiral;
            a transmission line path from an inner portion of the first transmission line spiral to an inner portion of the second transmission line spiral, wherein the transmission line comprises a signal line and a ground path; and
        a first capacitor coupled to the first and the second transmission line spirals.

12. The apparatus of claim 11 further comprising a variable capacitance capacitor coupled in parallel with the first capacitor, wherein the first capacitor has a fixed capacitance.

13. The apparatus of claim 11 wherein the first transmission line spiral, the second transmission line spiral, and the transmission line path comprise a single coaxial cable.

14. The apparatus of claim 11 wherein the first and the second transmission line spirals are rectangular spirals.

15. The apparatus of claim 11 wherein the ground path comprises:
    a first pair of grounding spirals having the signal line positioned therebetween; and
    a second pair of grounding spirals having the signal line positioned therebetween, wherein each of the first pair of grounding spirals and each of the second pair of grounding spirals have a shape that substantially mirrors the shape of the first transmission line spiral.

16. The apparatus of claim 11 wherein the signal line comprises:
    a first signal line spiral having a spiral shape that substantially mirrors the spiral shape of the first transmission line spiral; and
    a second signal line having a spiral shape that substantially mirrors the spiral shape of the first transmission line spiral, wherein the signal line is configured to convey a signal through the first signal line spiral to the second signal line spiral via a signal line path from an inner region of the first spiral signal line to an inner region of the second spiral signal line.

17. A method of manufacturing an impedance matching device comprises:
    forming an inductor comprising:
        forming a first transmission line spiral along a first planar region; and
        forming a second transmission line spiral along a second planar region parallel to the first planar region such that a shape of the second transmission line spiral substantially mirrors a shape of the first transmission line spiral, wherein a centroid region of the first transmission line spiral is electrically coupled to a centroid region of the second transmission line spiral, and wherein the first and the second transmission line spirals comprise a signal path and a ground path; and
electrically coupling a capacitor to the ground path.

18. The method of claim 17 wherein forming the first and the second transmission line spirals comprises:
   forming a first portion of the ground path such that a shape of the first portion of the ground path substantially mirrors the shape of the first transmission line spiral; and
   forming a second portion of the ground path such that a shape of the second portion of the ground path substantially mirrors the shape of the first transmission line spiral, wherein electrically coupling the capacitor to the ground path electrically couples the capacitor to the first and the second portions of the ground path.

19. The method of claim 17 further comprising coupling a variable capacitor in parallel with the capacitor.

20. The method of claim 17 further comprising:
   forming a first plurality of printed circuit board dielectric layers along the first planar region; and
   forming a second plurality of printed circuit board dielectric layers along the second planar region.

21. The method of claim 17 wherein forming the inductor comprises forming the inductor from a single coaxial cable.

22. The method of claim 17 further comprising electrically coupling a preamplifier to the transmission line.

* * * * *